(12) United States Patent
Bae et al.

(10) Patent No.: US 11,444,363 B2
(45) Date of Patent: Sep. 13, 2022

(54) FLEXIBLE CABLE INCLUDING A TRANSMISSION LINE HAVING AN AIR GAP CONFIGURED TO PREVENT SIGNALS FROM PROPAGATING TO THE AIR GAP

(71) Applicant: Samsung Electronics Co., Ltd., Suwon-si (KR)

(72) Inventors: Bumhee Bae, Suwon-si (KR); Minseok Kim, Suwon-si (KR); Younho Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 157 days.

(21) Appl. No.: 16/813,998

(22) Filed: Mar. 10, 2020

(65) Prior Publication Data

US 2020/0359493 A1  Nov. 12, 2020

(30) Foreign Application Priority Data

May 8, 2019 (KR) .................. 10-2019-0053596

(51) Int. Cl.
*H01P 3/08* (2006.01)
*H05K 1/02* (2006.01)
*H05K 1/11* (2006.01)

(52) U.S. Cl.
CPC ............ *H01P 3/082* (2013.01); *H01P 3/081* (2013.01); *H01P 3/088* (2013.01); *H05K 1/024* (2013.01);
(Continued)

(58) Field of Classification Search
CPC .......... H01P 3/082; H01P 3/088; H01P 3/006; H01P 3/003; H05K 1/0278
(Continued)

(56) References Cited

U.S. PATENT DOCUMENTS

| 6,600,395 B1 * | 7/2003 | Handforth et al. ..... H01P 3/085 174/117 AS |
| 9,913,412 B2 | 3/2018 | Chen et al. |

(Continued)

FOREIGN PATENT DOCUMENTS

| KR | 10-2013-0120101 A | 11/2013 |
| KR | 10-2018-0019472 A | 2/2018 |
| WO | 2015-142427 A1 | 9/2015 |

OTHER PUBLICATIONS

International Search Report with Written Opinion dated Jun. 16, 2020; International application No. PCT/KR2020/003220.

*Primary Examiner* — Benny T Lee

(74) *Attorney, Agent, or Firm* — Jefferson IP Law, LLP

(57) ABSTRACT

A flexible cable is provided. The flexible cable includes a first insulation part, a second insulation part disposed on the first insulation part, a first group of ground parts disposed at regular intervals under the first insulation part, at least one transmission line disposed at regular intervals under the first insulation part and alternately arranged with the first group of ground parts, an air gap formed under the first insulation part, a prepreg layer disposed under the first insulation part, and a third insulation part disposed under the air gap and the prepreg layer. The air gap is configured to prevent signals emitted from the at least one transmission line from propagating in a direction of the air gap. Hence, it is possible to shield electromagnetic interference with other electronic components while minimizing the signal loss.

20 Claims, 4 Drawing Sheets

(52) U.S. Cl.
CPC ............ *H05K 1/0219* (2013.01); *H05K 1/115* (2013.01); *H05K 2201/0715* (2013.01); *H05K 2201/0723* (2013.01); *H05K 2201/09981* (2013.01)

(58) Field of Classification Search
USPC ...................................................... 333/1, 238
See application file for complete search history.

(56) References Cited

U.S. PATENT DOCUMENTS

| | | |
|---|---|---|
| 2009/0133906 A1 | 5/2009 | Baek |
| 2016/0181681 A1* | 6/2016 | Sarabandi et al. ...... H01P 3/006 333/21 R |
| 2018/0048044 A1* | 2/2018 | Ou et al. ................. H01P 3/006 |
| 2018/0053981 A1 | 2/2018 | Bae et al. |
| 2019/0045630 A1 | 2/2019 | Kim et al. |

* cited by examiner

FLEXIBLE CABLE INCLUDING A TRANSMISSION LINE HAVING AN AIR GAP CONFIGURED TO PREVENT SIGNALS FROM PROPAGATING TO THE AIR GAP

CROSS-REFERENCE TO RELATED APPLICATION(S)

This application is based on and claims priority under 35 U.S.C. § 119(a) of a Korean patent application number 10-2019-0053596, filed on May 8, 2019, in the Korean Intellectual Property Office, the disclosure of which is incorporated by reference herein in its entirety.

BACKGROUND

1. Field

The disclosure relates to a flexible cable capable of shielding against electromagnetic interference.

2. Description of Related Art

Electronic devices such as computers, smartphones, and tablet personal computers are becoming smaller, slimmer and more versatile.

Such an electronic device may use various electronic components, such as a processor, memory, speaker, microphone, sensor, camera, antenna, and/or communication module, mounted on a printed circuit board (PCB) or connected through a flexible printed circuit board (FPCB).

This PCB or FPCB may function as a cable for connecting various electronic components to each other.

Meanwhile, FPCBs and cables used in electronic devices are becoming thinner, and requirements for shielding against electromagnetic interference (EMI) are becoming stricter.

When the electronic device simultaneously uses a high speed signal and a low speed signal, the loss of signal may increase due to electromagnetic interference between the high speed signal and the low speed signal.

To reduce such signal loss, it is possible to utilize an FPCB having a microstrip structure where the signal transmission line is located at the outermost portion.

As the FPCB having a microstrip structure has a signal transmission line located at the outermost portion, the microstrip structure may directly emit electromagnetic waves to nearby electronic components (e.g., antenna or communication module), thereby causing a noise problem, and such a FPCB may be not suitable for high speed signals (e.g., 5th generation (5G) signals).

For mitigation of the noise problem and for application to a high speed signal, it is necessary to increase the EMI shielding efficiency of the FPCB used in the electronic device.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above mentioned problems and/or disadvantages and to provide at least the advantages described below. Accordingly, an aspect of the disclosure is to provide a flexible cable that can minimize the loss of a high speed signal and shield electromagnetic interference with other electronic components by using a shielding layer formed under at least one signal transmission line.

Additional aspects will be set forth in part in the description which follows and, in part, will be apparent from the description, or may be learned by practice of the presented embodiments.

In accordance with an aspect of the disclosure, a flexible cable is provided. The flexible cable includes a first insulation part, a second insulation part disposed on the first insulation part, a first group of ground parts disposed at regular intervals under the first insulation part, at least one signal transmission line disposed at regular intervals under the first insulation part and alternately arranged with ground parts of the first group, an air gap formed in at least some portion under the first insulation part, a prepreg layer disposed on at least some portion under the first insulation part, and a third insulation part disposed under the air gap and the prepreg layer, wherein the air gap may be configured to act as a shield thereby preventing signals emitted from the at least one signal transmission line from propagating in the direction of the air gap.

According to various embodiments of the disclosure, the flexible cable includes a shielding layer (e.g., air gap, insulation part, and ground shielding layer) formed under at least one signal transmission line, minimizing the loss of a high speed signal and shielding electromagnetic interference with other electronic components.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. The description includes various specific details to assist in that understanding but these details are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

It should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The same or similar reference symbols may be used throughout the drawings to refer to the same or like parts. In the description of items, the singular forms "a", "an" and "the" are intended to include the plural forms as well, unless the context clearly indicates otherwise. In the description, the expression "A or B", "at least one of A and B", "at least one of A or B", "A, B or C", "at least one of A, B and C" or "at least one of A, B or C" may indicate all possible combinations of the listed items. The terms "first" and "second" may refer to various elements regardless of importance and/or order and are used to distinguish one element from another element without limitation.

Figure 1:
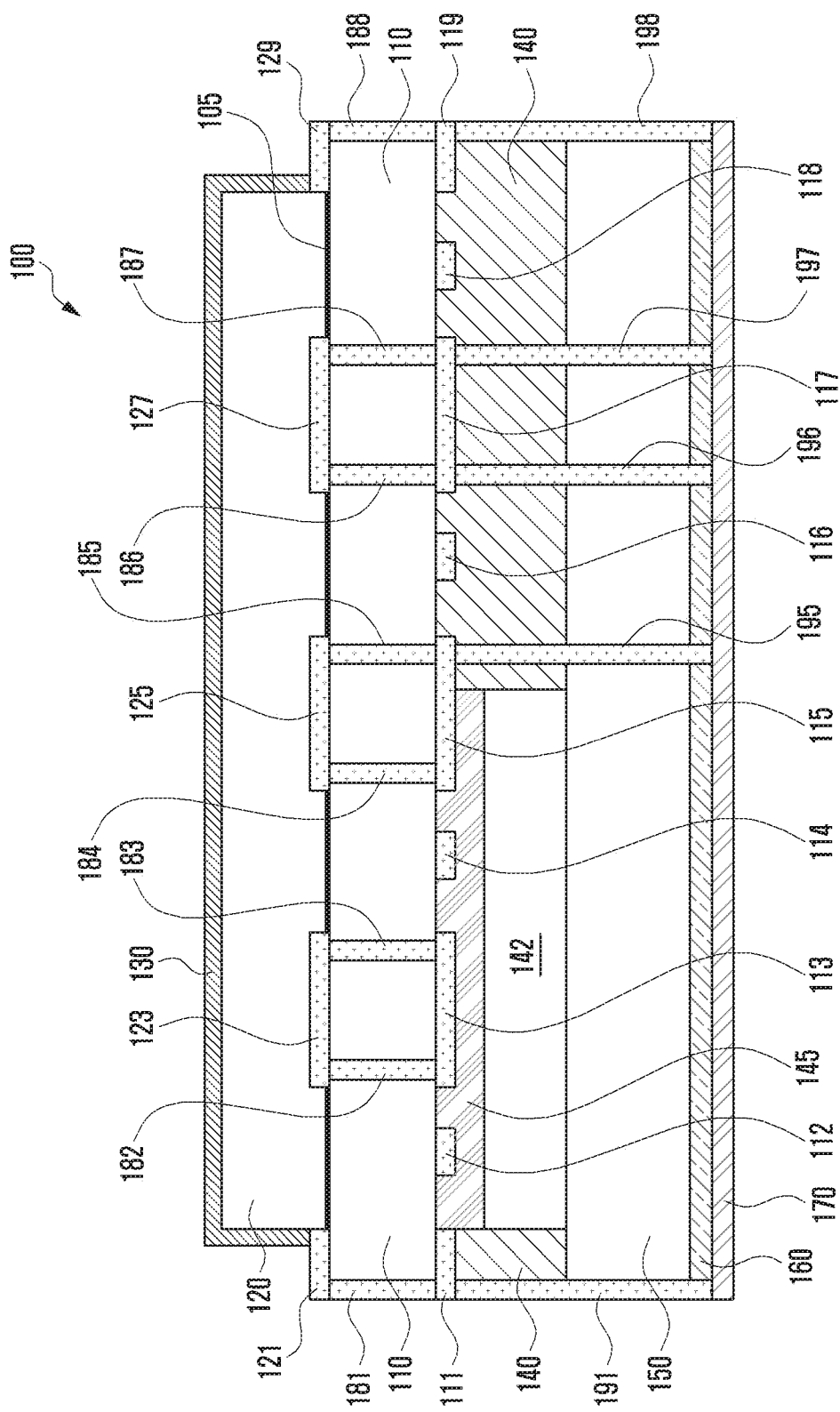
FIG. 1 is a cross-sectional view showing a configuration of a flexible cable according to an embodiment of the disclosure.

FIG. 1 is a cross-sectional view showing a configuration of a flexible cable according to an embodiment of the disclosure.

Referring to FIG. 1, the flexible cable 100 according to various embodiments of the disclosure may include a first insulation part 110, a second insulation part 120, a shielding part 130, a prepreg layer 140, an air gap 142, a third insulation part 150, a ground shielding layer 160, and/or a fourth insulation part 170.

In various embodiments, the first insulation part 110 may be made of a material having an insulating property. The first insulation part 110 may be made of a dielectric. The first insulation part 110 may include a copper clad laminate (CCL).

In one embodiment, under the first insulation part 110, a first ground part 111, a second ground part 113, a third ground part 115, a fourth ground part 117, and a fifth ground part 119 may be disposed at regular intervals. The first ground part 111, the second ground part 113, the third ground part 115, the fourth ground part 117, and the fifth ground part 119 may be made of a conductive metal (e.g., copper) through which a current can be conducted.

In one embodiment, under the first insulation part 110, a first signal transmission line 112, a second signal transmission line 114, a third signal transmission line 116, and a fourth signal transmission line 118 are disposed at regular intervals. The first signal transmission line 112, the second signal transmission line 114, the third signal transmission line 116, and the fourth signal transmission line 118 may be made of a conductive metal (e.g., copper) through which a current can be conducted. The first signal transmission line 112, the second signal transmission line 114, the third signal transmission line 116, and the fourth signal transmission line 118 may include a microstrip line through which communication signals can be transmitted and received.

In one embodiment, the first signal transmission line 112 may be disposed between the first ground part 111 and the second ground part 113. The second signal transmission line 114 may be disposed between the second ground part 113 and the third ground part 115. The third signal transmission line 116 may be disposed between the third ground part 115 and the fourth ground part 117. The fourth signal transmission line 118 may be disposed between the fourth ground part 117 and the fifth ground part 119.

In one embodiment, the first signal transmission line 112 and the second signal transmission line 114 may each be used for high speed signal transmission. The third signal transmission line 116 and the fourth signal transmission line 118 may each be used for low speed signal transmission or high speed signal transmission. The first signal transmission line 112 and the second signal transmission line 114, and the third signal transmission line 116 and the fourth signal transmission line 118 may transmit differential signals with different phases.

In one embodiment, the high speed signal may include at least one of a 5G communication signal, a Wi-Fi signal, a radio frequency (RF) signal, or an intermediate frequency (IF) signal. The low speed signal may include at least one of an audio signal, a power signal, or a control signal.

In one embodiment, the first ground part 111, the first signal transmission line 112, the second ground part 113, the second signal transmission line 114, the third ground part 115, the third signal transmission line 116, the fourth ground part 117, the fourth signal transmission line 118, and the fifth ground part 119 may be formed by laminating a copper thin film layer under the first insulation part 110 and etching at least a portion of the copper thin film layer. At least one power line (not shown) may be disposed between the first ground part 111 and the second ground part 113. At least one power line (not shown) may be disposed between the second ground part 113 and the third ground part 115.

In one embodiment, on top of the first insulation part 110, a sixth ground part 121, a seventh ground part 123, an eighth ground part 125, a ninth ground part 127, and a tenth ground part 129 may be disposed at regular intervals. The sixth ground part 121, the seventh ground part 123, the eighth ground part 125, the ninth ground part 127, and the tenth ground part 129 may be made of a conductive metal (e.g., copper) through which a current can be conducted.

In one embodiment, the sixth ground part 121, the seventh ground part 123, the eighth ground part 125, the ninth ground part 127, and the tenth ground part 129 disposed on top of the first insulation part 110 may be arranged so as to face the first ground part 111, the second ground part 113, the third ground part 115, the fourth ground part 117, and the fifth ground part 119 disposed under the first insulation part 110, respectively.

In one embodiment, a via may be formed between a ground part disposed on top of the first insulation part 110 and a ground part disposed under the first insulation part 110. Specifically, a first via 181 may be formed between the sixth ground part 121 disposed on top of the first insulation part 110 and the first ground part 111 disposed under the first insulation part 110. A second via 182 and a third via 183 may be formed between the seventh ground part 123 disposed on top of the first insulation part 110 and the second ground part 113 disposed under the first insulation part 110. A fourth via 184 and a fifth via 185 may be formed between the eighth ground part 125 disposed on top of the first insulation part 110 and the third ground part 115 disposed under the first insulation part 110. A sixth via 186 and a seventh via 187 may be formed between the ninth ground part 127 disposed on top of the first insulation part 110 and the fourth ground part 117 disposed under the first insulation part 110. An eighth via 188 may be formed between the tenth ground part 129 disposed on top of the first insulation part 110 and the fifth ground part 119 disposed under the first insulation part 110. The first to eighth vias 181 to 188 may allow heterogeneous metals to conduct electricity. The first to eighth vias 181 to 188 may include one of plating, sputtering, or via hole plating.

In one embodiment, the first via 181 may be formed to penetrate the first insulation part 110 to allow electricity to flow between the first ground part 111 and the sixth ground part 121. The second via 182 may be formed to penetrate the first insulation part 110 to allow electricity to flow between a first end of the second ground part 113 and a first end of the seventh ground part 123. The third via 183 may be formed to penetrate the first insulation part 110 to allow electricity to flow between a second end of the second ground part 113 and a second end of the seventh ground part 123. The fourth via 184 may be formed to penetrate the first insulation part 110 to allow electricity to flow between a first end of the third ground part 115 and a first end of the eighth ground part 125. The fifth via 185 may be formed to penetrate the first insulation part 110 to allow electricity to flow between a second end of the third ground part 115 and a second end of the eighth ground part 125. The sixth via 186 may be formed to penetrate the first insulation part 110 to allow electricity to flow between a first end of the fourth ground part 117 and a first end of the ninth ground part 127. The seventh via 187 may be formed to penetrate the first insulation part 110 to allow electricity to flow between a second end of the fourth ground part 117 and a second end of the ninth ground part 127. The eighth via 188 may be formed to penetrate the first insulation part 110 to allow electricity to flow between the fifth ground part 119 and the sixth ground part 129.

In one embodiment, the first via 181 and the second via 182 may shield the radio wave (e.g., first high speed signal) carried by the first signal transmission line 112 disposed therebetween from being interfered with the radio wave (e.g., second high speed signal) carried by the second signal transmission line 114. The third via 183 and the fourth via 184 may shield the radio wave (e.g., second high speed signal) carried by the second signal transmission line 114 disposed therebetween from being interfered with the radio wave (e.g., first high speed signal) carried by the first signal transmission line 112. The fifth via 185 and the sixth via 186 may shield the radio wave (e.g., high or low speed signal) carried by the third signal transmission line 116 disposed therebetween. The seventh via 187 and the eighth via 188 may shield the radio wave (e.g., high or low speed signal) carried by the fourth signal transmission line 118 disposed therebetween.

In one embodiment, as the first signal transmission line 112 is surrounded by the first ground part 111, the second ground part 113, the first via 181, the second via 182, the sixth ground part 121, and the seventh ground part 123, the radio wave transmitted to the outside of the flexible cable 100 and the noise transmitted from the outside of the flexible cable 100 may be shielded. As the second signal transmission line 114 is surrounded by the second ground part 113, the third ground part 115, the third via 183, the fourth via 184, the seventh ground part 123, and the eighth ground part 125, the radio wave transmitted to the outside of the flexible cable 100 and the noise transmitted from the outside of the flexible cable 100 may be shielded. As the third signal transmission line 116 is surrounded by the third ground part 115, the fourth ground part 117, the fifth via 185, the sixth via 186, the eighth ground part 125, and the ninth ground part 127, the radio wave transmitted to the outside of the flexible cable 100 and the noise transmitted from the outside of the flexible cable 100 may be shielded. As the fourth signal transmission line 118 is surrounded by the fourth ground part 117, the fifth ground part 119, the seventh via 187, the eighth via 188, the ninth ground part 127, and the tenth ground part 129, the radio wave transmitted to the outside of the flexible cable 100 and the noise transmitted from the outside of the flexible cable 100 may be shielded.

In various embodiments, the second insulation part 120 may be made of a material having an insulating property. The second insulation part 120 may be made of a dielectric. The second insulation part 120 may include a cover layer.

In one embodiment, the second insulation part 120 may be disposed on top of the first insulation part 110. The second insulation part 120 and the first insulation part 110 may be adhered to each other through a bonding sheet 105. The bonding sheet 105 may improve the adhesion of the internal components of the flexible cable 100. The bonding sheet 105 may perform an insulation function. The second insulation part 120 may surround at least a portion of the seventh ground part 123, the eighth ground part 125, and the ninth ground part 127.

In various embodiments, the shielding part 130 may be adhered to the outside of the second insulation part 120 to perform a shielding function. The shielding part 130 may be made of a conductive material. The shielding part 130 may include an electromagnetic interference (EMI) film. The shielding part 130 may be formed through metal sputtering. The shielding part 130 may prevent the electromagnetic wave from being emitted to the outside of the flexible cable 100. The shielding part 130 may include a conductive adhesive layer and an insulating layer. The shielding part 130 may include a conductive adhesive layer, a metal layer, and an insulating layer.

In various embodiments, the prepreg layer 140 may be disposed in at least some portion under the first insulation part 110. The prepreg layer 140 may surround at least a portion of the first ground part 111, at least a portion of the third ground part 115, the third signal transmission line 116, and the fourth ground part 117, the fourth signal transmission line 118, and at least a portion of the fifth ground part 119.

In various embodiments, the air gap 142 may be formed in at least some portion under the first insulation part 110. The air gap 142 may surround at least a portion of the first signal transmission line 112, the second ground part 113, the second signal transmission line 114, and the third ground part 115. The air gap 142 may prevent the signals emitted from the first signal transmission line 112 and the second signal transmission line 114 from propagating toward the air gap 142, thereby minimizing the signal loss.

In one embodiment, a fifth insulation part 145 may be disposed between the lower portion of the first insulation part 110 and the air gap 142. The fifth insulation part 145 may be made of a material having an insulating property. The fifth insulation part 145 may be made of a dielectric. The fifth insulation part 145 may include a cover layer.

Although it is described that the prepreg layer 140 and the air gap 142 are formed under the first insulation part 110, the prepreg layer 140 may be omitted. In one embodiment, only the air gap 142 may be formed under the first insulation part 110.

In various embodiments, the third insulation part 150 may be disposed under the prepreg layer 140 and the air gap 142. When only the air gap 142 is formed under the first insulation part 110, the third insulation part 150 may be disposed under the air gap 142. The third insulation part 150 may be made of a material having an insulating property. The third insulation part 150 may be made of a dielectric. The third insulation part 150 may include a CCL.

In various embodiments, the ground shielding layer 160 may be disposed under the third insulation part 150. The ground shielding layer 160 may be made of a conductive material. The ground shielding layer 160 may include metal powder in the dielectric, and thus may exhibit anisotropic or isotropic conductivity. The ground shielding layer 160 may enhance the grounding function of the flexible cable 100.

In one embodiment, a ninth via 191, a tenth via 195, an eleventh via 196, a twelfth via 197, and a thirteenth via 198 may be formed between the first ground part 111 and the ground shielding layer 160, between the third ground part 115 and the ground shielding layer 160, between the fourth ground part 117 and the ground shielding layer 160, and between the fifth ground part 119 and the ground shielding layer 160, respectively. The ninth to thirteenth vias 191 to 198 may allow heterogeneous metals to conduct electricity. The ninth to thirteenth vias 191 to 198 may include one of plating, sputtering, or via hole plating.

In one embodiment, the ninth via 191, the tenth via 195, the eleventh via 196, the twelfth via 197, and the thirteenth via 198 may electrically connect the first ground part 111, the third ground part 115, the fourth ground part 117, and the fifth ground part 119, respectively, to the ground shielding layer 160, enhancing the grounding function.

In one embodiment, the ninth via 191 may be formed to penetrate the third insulation part 150 to allow electricity to flow between the first ground part 111 and the ground shielding layer 160. The tenth via 195 may be formed to penetrate the third insulation part 150 to allow electricity to flow between the third ground part 115 and the ground shielding layer 160. The eleventh via 196 may be formed to penetrate the third insulation part 150 to allow electricity to flow between a first end of the fourth ground part 117 and the ground shielding layer 160. The twelfth via 197 may be formed to penetrate the third insulation part 150 to allow electricity to flow between a second end of the fourth ground part 117 and the ground shielding layer 160. The thirteenth via 198 may be formed to penetrate the third insulation part 150 to allow electricity to flow between the fifth ground part 119 and the ground shielding layer 160.

In one embodiment, the sixth ground part 121, the first via 181, the first ground part 111, the ninth via 191, and the ground shielding layer 160 may be connected to each other, allowing electricity to flow there through. The eighth ground part 125, the fifth via 185, the third ground part 115, the tenth via 195, and the ground shielding layer 160 may be connected to each other, allowing electricity to flow there through. The first end of the ninth ground part 127, the sixth via 186, the first end of the fourth ground part 117, the eleventh via 196, and the ground shielding layer 160 may be connected to each other, allowing electricity to flow there through. The second end of the ninth ground part 127, the seventh via 187, the second end of the fourth ground part 117, the twelfth via 197, and the ground shielding layer 160 may be connected to each other, allowing electricity to flow there through. The tenth ground part 129, the eighth via 188, the fifth ground part 119, the thirteenth via 198, and the ground shielding layer 160 may be connected to each other, allowing electricity to flow there through.

In various embodiments, the fourth insulation part 170 may be disposed under the ground shielding layer 160. The fourth insulation part 170 may be made of a material having an insulating property. The fourth insulation part 170 may be made of a dielectric. The fourth insulation part 170 may include a cover layer.

Figure 2:
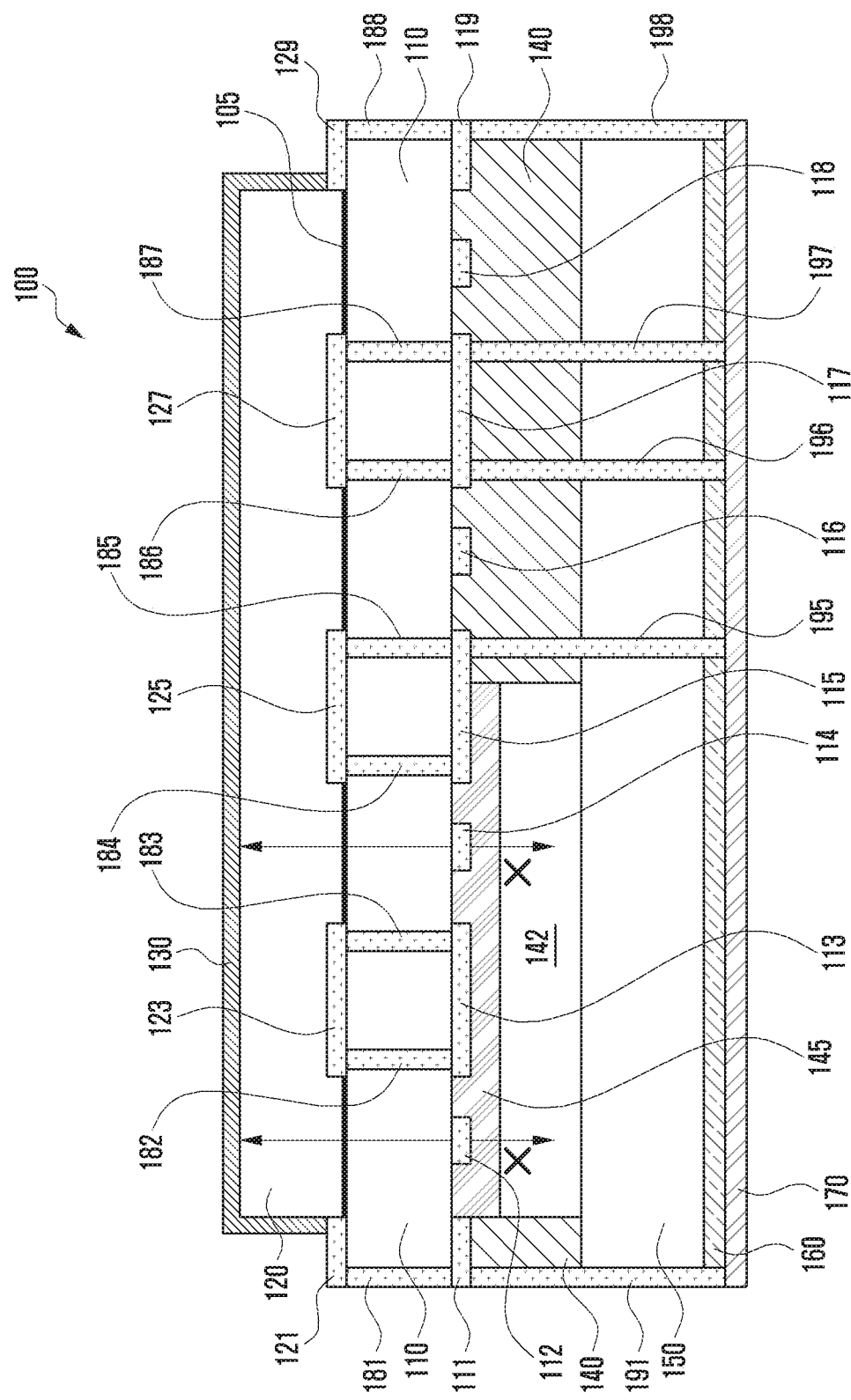
FIG. 2 illustrates electromagnetic shielding of a flexible cable according to an embodiment of the disclosure.

FIG. 2 illustrates electromagnetic shielding of a flexible cable according to an embodiment of the disclosure.

In the description of FIG. 2, overlapping descriptions of the same structures and functions as those of the embodiment described with reference to FIG. 1 may be omitted.

Referring to FIG. 2, in the flexible cable 100 according to various embodiments of the disclosure, the air gap 142 formed in at least some portion under the first insulation part 110 may function as a shielding layer. The air gap 142 may allow radio waves radiated from the first signal transmission line 112 and the second signal transmission line 114 to propagate upward and may prevent such radio waves from propagating downward towards the gap 142.

In one embodiment, the air gap 142 may constitute a shielding layer together with the third insulation part 150 disposed thereunder and the ground shielding layer 160 disposed under the third insulation part 150, thereby forming a complete shielding structure.

In one embodiment, the loss of the signal radiated from the first signal transmission line 112 and the second signal transmission line 114 may include a conductive loss due to the resistance of the conductor and a dielectric loss due to the capacitance component of the dielectric. Referring to FIG. 2, when the air gap 142 is formed under the first signal transmission line 112 and the second signal transmission line 114, as the capacitance component of the dielectric is reduced, the line widths of the first signal transmission line 112 and the second signal transmission line 114 can be increased, thereby reducing the conductive loss.

In one embodiment, high speed signals radiated from the first signal transmission line 112 and the second signal transmission line 114 may propagate in the direction of the first insulation part 110 and may not propagate in the direction of the air gap 142 (e.g., indicated by x in FIG. 2). Hence, the signal loss can be minimized.

Figure 3:
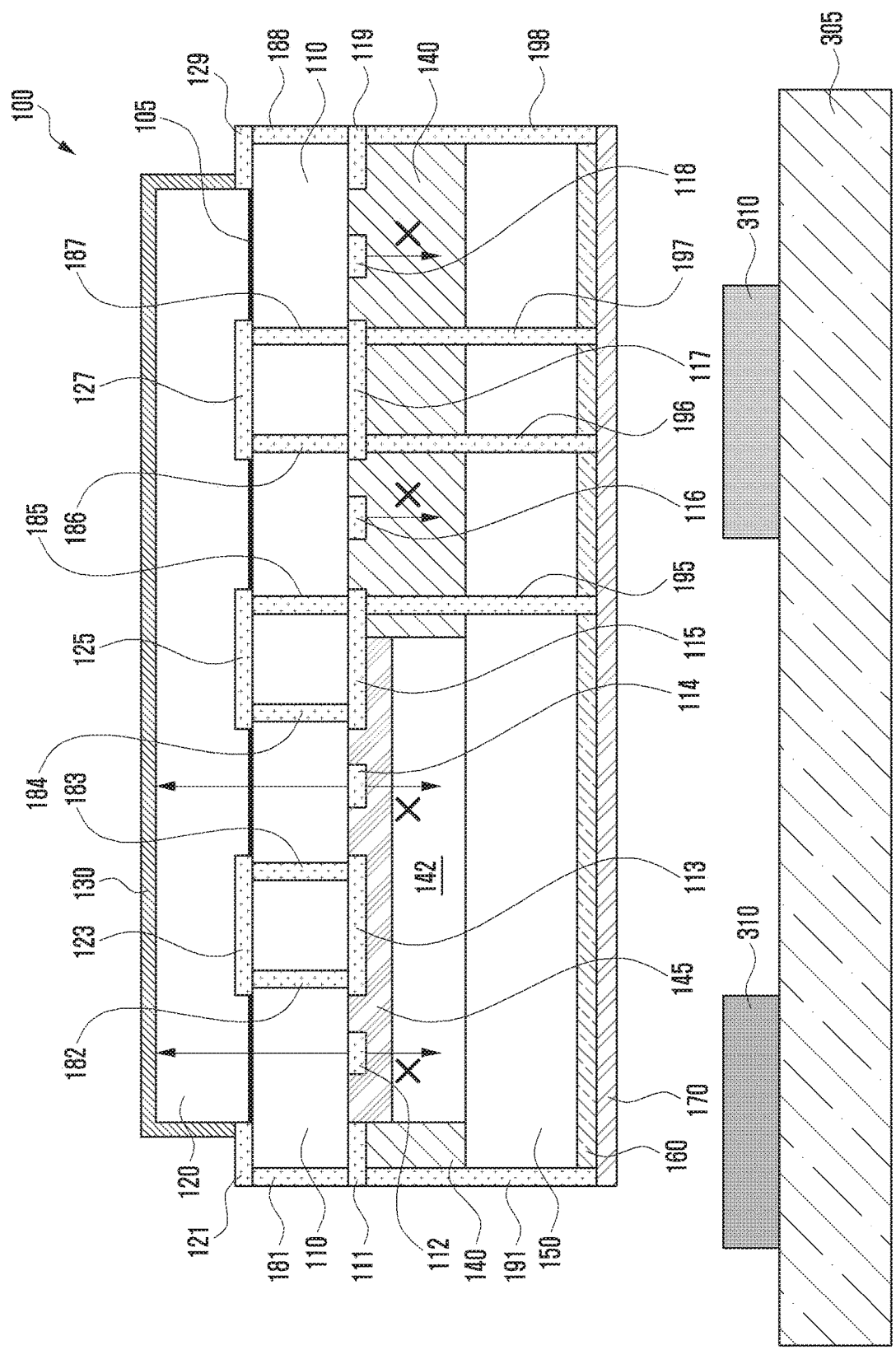
FIG. 3 illustrates electromagnetic shielding between a flexible cable and other electronic components according to an embodiment of the disclosure.

FIG. 3 illustrates electromagnetic shielding between a flexible cable and other electronic components according to an embodiment of the disclosure.

In the description of FIG. 3, overlapping descriptions of the same structures and functions as those of the embodiment described with reference to FIGS. 1 and 2 may be omitted.

Referring to FIG. 3, in the flexible cable 100 according to various embodiments of the disclosure, at least a portion of the air gap 142 and the prepreg layer 140 formed under the first insulation part 110 may function as a shielding layer.

In one embodiment, the air gap 142 may allow high speed signals radiated from the first signal transmission line 112 and the second signal transmission line 114 to propagate in the upward direction and may prevent them from propagating in the downward direction. High speed signals radiated from the first signal transmission line 112 and the second signal transmission line 114 may propagate in the direction of the first insulation part 110 and may not propagate in the direction of the air gap 142 (e.g., indicated by x in FIG. 3). Consequently, other electronic components 310 (e.g., antenna or communication module) mounted on, for example, a printed circuit board (PCB) 305 may be shielded from radiation of electromagnetic waves produced by the first signal transmission line 112 and the second signal transmission line 114.

In one embodiment, the prepreg layer 140 may allow low speed or high speed signals radiated from the third signal transmission line 116 and the fourth signal transmission line 118 to propagate in the upward direction and may prevent them from propagating in the downward direction. Low speed or high speed signals radiated from the third signal transmission line 116 and the fourth signal transmission line 118 may propagate in the direction of the first insulation part 110 and may not propagate in the direction of the prepreg layer 140 (e.g., indicated by x in FIG. 3). Consequently, other electronic components 310 (e.g., antenna or communication module) mounted on, for example, the PCB 305 may be shielded from radiation of electromagnetic waves produced by the third signal transmission line 116 and the fourth signal transmission line 118.

In one embodiment, at least a portion of the air gap 142 and the prepreg layer 140 formed under the third insulation part 150 may constitute a shielding layer together with the third insulation part 150 disposed thereunder and the ground shielding layer 160 disposed under the third insulation part 150, thereby forming a complete shielding structure.

Figure 4:
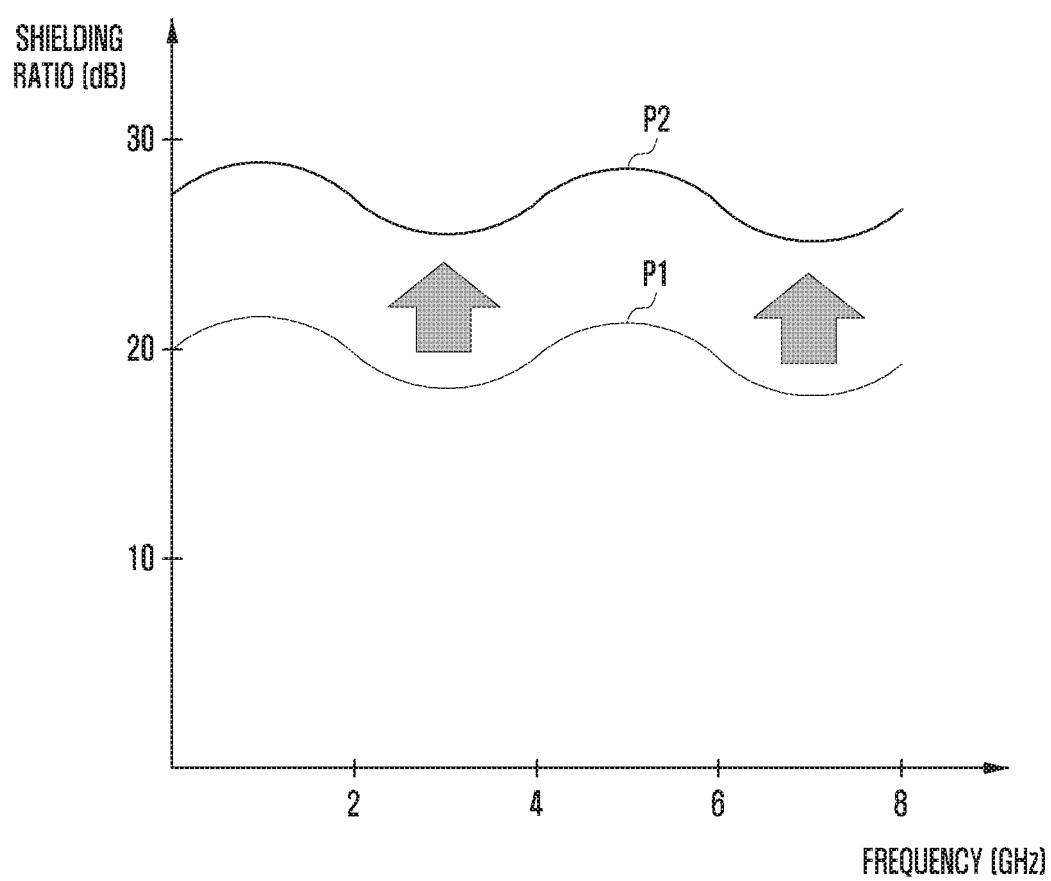
FIG. 4 shows a graph comparing shielding ratios of flexible cables according to an embodiment of the disclosure.

FIG. 4 shows a graph comparing shielding ratios of flexible cables according to an embodiment of the disclosure.

Referring to FIG. 4, the shielding ratio of a related art flexible cable is represented by P1, and the shielding ratio of the flexible cable of the disclosure is represented by P2. In FIG. 4, a horizontal axis may indicate a frequency and a vertical axis may indicate a shielding rate.

It can be seen from FIG. 4 that the flexible cable according to various embodiments of the disclosure has improved the shielding ratio compared to the related art flexible cable.

For example, the shielding ratio of the flexible cable according to various embodiments of the disclosure is improved by about 7-8 dB depending upon frequencies, compared to the related art flexible cable.

According to various embodiments of the disclosure as described, for example, with respect to FIG. 3, the flexible cable 100 may shield electromagnetic interference with other electronic components 310 (e.g., antenna or communication module) while minimizing the signal loss by forming a shielding layer (e.g., at least one of the air gap 142, the prepreg layer 140, the third insulation part 150, the ground shielding layer 160, or the fourth insulation part 170) under the first signal transmission line 112, the second signal transmission line 114, the third signal transmission line 116 and the fourth signal transmission line 118.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A flexible cable comprising:
a first insulation part;
a second insulation part disposed on the first insulation part;
a first group of ground parts disposed at regular intervals under the first insulation part;
at least one transmission line disposed at regular intervals under the first insulation part and alternately arranged with the first group of ground parts;
an air gap formed under a portion of the first insulation part;
a prepreg layer disposed under another portion of the first insulation part; and
a third insulation part disposed under the air gap and the prepreg layer,
wherein the air gap is configured to prevent signals emitted from the at least one transmission line from propagating toward the air gap.

2. The flexible cable of claim 1, wherein the at least one transmission line includes a microstrip line through which communication signals can be transmitted and received.

3. The flexible cable of claim 1, wherein the first insulation part and the second insulation part are adhered to each other through a bonding sheet.

4. The flexible cable of claim 1, wherein the air gap and the prepreg layer form a single surface under the first insulation part.

5. The flexible cable of claim 1, further comprising a shielding part adhered to the second insulation part to perform a shielding function.

6. The flexible cable of claim 5, further comprising a ground shielding layer disposed under the third insulation part.

7. The flexible cable of claim 6, wherein the prepreg layer, the third insulation part and the ground shielding layer form a shielding layer that causes signals emitted from the at least one transmission line to propagate toward the shielding part.

8. The flexible cable of claim 6, further comprising a fourth insulation part disposed under the ground shielding layer.

9. The flexible cable of claim 6, wherein the air gap, the third insulation part and the ground shielding layer form a shielding layer that causes signals emitted from the at least one transmission line to propagate toward the shielding part.

10. The flexible cable of claim 1, further comprising a second group of ground parts disposed at regular intervals on top of the first insulation part.

11. The flexible cable of claim 10,
wherein the first group of ground parts includes two or more of a first ground part, a second ground part, a third ground part, a fourth ground part, and a fifth ground part,
wherein the at least one transmission line includes at least one of a first transmission line, a second transmission line, a third transmission line, or a fourth transmission line, and
wherein the second group of ground parts includes two or more of a sixth ground part, a seventh ground part, an eighth ground part, a ninth ground part, and a tenth ground part.

12. The flexible cable of claim 11, wherein the first transmission line, the second transmission line, the third transmission line, and the fourth transmission line are configured to transmit differential signals with different phases.

13. The flexible cable of claim 11,
wherein the first transmission line is disposed between the first ground part and the second ground part to transmit a first high speed signal,
wherein the second transmission line is disposed between the second ground part and the third ground part to transmit a second high speed signal,
wherein the third transmission line is disposed between the third ground part and the fourth ground part to transmit a low or high speed signal, and
wherein the fourth transmission line is disposed between the fourth ground part and the fifth ground part to transmit a low or high speed signal.

14. The flexible cable of claim 11, wherein the first ground part, the second ground part, the third ground part, the fourth ground part, and the fifth ground part disposed under the first insulation part are arranged to face the sixth ground part, the seventh ground part, the eighth ground part, the ninth ground part, and the tenth ground part disposed on top of the first insulation part, respectively.

15. The flexible cable of claim 14, wherein the air gap is formed to surround the first transmission line, the second ground part, the second transmission line, and a portion of the third ground part.

16. The flexible cable of claim 14, wherein the prepreg layer is formed to surround at least a portion of the first ground part, at least a portion of the third ground part, the third transmission line, the fourth ground part, the fourth transmission line, and a portion of the fifth ground part.

17. The flexible cable of claim 11, further comprising at least one of:
- a first via formed to penetrate the first insulation part to allow electricity to flow between the first ground part and the sixth ground part;
- a second via formed to penetrate the first insulation part to allow electricity to flow between a first end of the second ground part and a first end of the seventh ground part;
- a third via formed to penetrate the first insulation part to allow electricity to flow between a second end of the second ground part and a second end of the seventh ground part;
- a fourth via formed to penetrate the first insulation part to allow electricity to flow between a first end of the third ground part and a first end of the eighth ground part;
- a fifth via formed to penetrate the first insulation part to allow electricity to flow between a second end of the third ground part and a second end of the eighth ground part;
- a sixth via formed to penetrate the first insulation part to allow electricity to flow between a first end of the fourth ground part and a first end of the ninth ground part;
- a seventh via formed to penetrate the first insulation part to allow electricity to flow between a second end of the fourth ground part and a second end of the ninth ground part; and
- an eighth via formed to penetrate the first insulation part to allow electricity to flow between the fifth ground part and the tenth ground part.

18. The flexible cable of claim 17,
wherein the first via and the second via are formed to shield a radio wave carried by the first transmission line disposed therebetween from interfering with a radio wave carried by the second transmission line,
wherein the third via and the fourth via are formed to shield a radio wave carried by the second transmission line disposed therebetween from interfering with a radio wave carried by the first transmission line,
wherein the fifth via and the sixth via are formed to shield a radio wave carried by the third transmission line disposed therebetween, and
wherein the seventh and the eighth via are formed to shield a radio wave carried by the fourth transmission line disposed therebetween.

19. The flexible cable of claim 17, further comprising at least one of:
- a ninth via formed to penetrate the third insulation part to allow electricity to flow between the first ground part and a ground shielding layer;
- a tenth via formed to penetrate the third insulation part to allow electricity to flow between the third ground part and the ground shielding layer;
- an eleventh via formed to penetrate the third insulation part to allow electricity to flow between a first end of the fourth ground part and the ground shielding layer;
- a twelfth via formed to penetrate the third insulation part to allow electricity to flow between a second end of the fourth ground part and the ground shielding layer; and
- a thirteenth via formed to penetrate the third insulation part to allow electricity to flow between the fifth ground part and the ground shielding layer.

20. The flexible cable of claim 19,
wherein the sixth ground part, the first via, the first ground part, the ninth via, and the ground shielding layer are connected to each other to allow electricity to flow therethrough,
wherein the eighth ground part, the fifth via, the third ground part, the tenth via, and the ground shielding layer are connected to each other to allow electricity to flow therethrough,
wherein the first end of the ninth ground part, the sixth via, the first end of the fourth ground part, the eleventh via, and the ground shielding layer are connected to each other to allow electricity to flow therethrough,
wherein the second end of the ninth ground part, the seventh via, the second end of the fourth ground part, the twelfth via, and the ground shielding layer are connected to each other to allow electricity to flow therethrough, and
wherein the tenth ground part, the eighth via, the fifth ground part, the thirteenth via, and the ground shielding layer are connected to each other to allow electricity to flow therethrough.

\* \* \* \* \*